United States Patent
Jang

(10) Patent No.: US 10,083,726 B2
(45) Date of Patent: Sep. 25, 2018

(54) INPUT CIRCUIT AND SEMICONDUCTOR DEVICE INCLUDING THE SAME

(71) Applicant: SK hynix Inc., Gyeonggi-do (KR)

(72) Inventor: Yeonsu Jang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/480,098

(22) Filed: Apr. 5, 2017

(65) Prior Publication Data

US 2018/0005675 A1  Jan. 4, 2018

(30) Foreign Application Priority Data

Jun. 30, 2016 (KR) .......................... 10-2016-0082503

(51) Int. Cl.
G11C 7/22 (2006.01)
G11C 7/10 (2006.01)
G11C 5/14 (2006.01)

(52) U.S. Cl.
CPC ................ G11C 7/22 (2013.01); G11C 5/147 (2013.01); G11C 7/10 (2013.01)

(58) Field of Classification Search
CPC .............. G11C 7/22; G11C 5/147; G11C 7/10
See application file for complete search history.

(56) References Cited

U.S. PATENT DOCUMENTS

| 8,081,016 | B2 * | 12/2011 | Lee ................... H03K 19/00384 327/108 |
| 8,339,159 | B2 * | 12/2012 | Lee ......................... H03K 5/153 327/77 |
| 8,803,566 | B2 * | 8/2014 | Baek ................ H03K 19/00384 327/108 |
| 9,209,764 | B2 | 12/2015 | Cho et al. |
| 2011/0241736 | A1 * | 10/2011 | Lee ......................... H03K 5/082 327/108 |
| 2016/0072487 | A1 * | 3/2016 | Hwang ..................... H03L 5/00 327/306 |

FOREIGN PATENT DOCUMENTS

KR  1020170007036  1/2017

* cited by examiner

*Primary Examiner* — Tri Hoang
(74) *Attorney, Agent, or Firm* — IP & T Group LLP

(57) ABSTRACT

An input circuit may include: an internal bias generation unit suitable for generating first and second bias voltages in response to a first enable signal; a buffer control unit suitable for comparing a reference voltage to the first and second bias voltages, and generating a plurality of buffer control signals based upon the comparison of the reference voltage with the first and second bias voltages; and a buffer unit including a plurality of buffers, wherein a buffer is driven to receive the reference voltage and an external input signal, and generates an internal signal, in response to an activated buffer control signal among the plurality of buffer control signals.

20 Claims, 6 Drawing Sheets

INPUT CIRCUIT AND SEMICONDUCTOR DEVICE INCLUDING THE SAME

CROSS-REFERENCE TO RELATED APPLICATIONS

The present application claims priority of Korean Patent Application No. 10-2016-0082503, filed on Jun. 30, 2016, which is incorporated herein by reference in its entirety.

BACKGROUND

1. Field

This patent document relates to a semiconductor design technology, and more particularly, to an input circuit and a semiconductor device including the same.

2. Description of the Related Art

A semiconductor device uses an input circuit as an interface for converting an external signal applied from an outside device to an internal signal having suitable characteristics to be used in an internal circuit.

The input circuit may be installed at an input terminal of an address, data, clock signal, control signal or the like. The input circuit may be designed in consideration of an operating voltage of a semiconductor device, a reference voltage level and the range of an input signal.

The input circuit may be operated by a current source which is generated based on an operating voltage. The input circuit must be able to output a desired level internal signal, even though an operation condition is changed. For example, even when one or more of the characteristics of an external signal may change or when the operating or reference voltages of the semiconductor memory device change, the input circuit should be capable to output a suitable level internal signal.

FIG. 1 is a diagram illustrating an input circuit installed in a conventional semiconductor device.

Referring to FIG. 1, the input circuit may include a differential amplification unit 110 and a current sink unit 120. The differential amplification unit 110 may generate first and second output signals OIN and OREF by differentially amplifying an input signal IN and a reference voltage VREF, i.e., increasing the difference between the input signal IN and the reference voltage VREF. The current sink unit 120 controls the amount of current flowing through the differential amplification unit 110.

Such an input method is referred to as a pseudo-differential input method. According to the pseudo-differential input method, the input signal IN and the reference voltage VREF may have an asymmetric waveform because the reference voltage VREF does not swing, and output signals OREF and OIN of a receiving buffer circuit may also have an asymmetrical waveform.

The differential amplification unit 10 may include a first resistor R1, a second resistor R2, a first NMOS transistor N1 and a second NMOS transistor N2. The first resistor R1 may be positioned between a supply voltage terminal VDD and a second output node OREF. The second resistor R2 may be positioned between the supply voltage terminal VDD and a first output node OIN. The first NMOS transistor N1 may form a current path between the second output node OREF and a common node COMN in response to the input signal IN. The second NMOS transistor N2 may form a current path between the first output node OIN and the common node COMN in response to the reference voltage VREF.

The current sink unit 120 may include a third NMOS transistor N3 and a third resistor R3 which are coupled in series between the common mode COMN and a ground voltage terminal VSS.

The current sink unit 120 may control the amount of current flowing through the differential amplification unit 110 by adjusting the amount of current sinking from the differential amplification unit 110 to the ground voltage terminal VSS in response to an enable signal EN.

In order to improve the signal transmission speed, a termination scheme is applied to a receiving buffer circuit for transmitting a signal. The termination scheme may be divided into Center Tap Termination (CTT) and High Tap Termination (HTT) schemes.

The CTT scheme is to raise or lower the level of a signal to transmit by a predetermined level based on a voltage level corresponding to the half of the supply voltage. The HTT scheme is to lower the level of a signal to transmit by a predetermined level based on the supply voltage.

When the CTT scheme is applied to the receiving buffer circuit, no problems occur. However, when the HTT scheme is applied to the receiving buffer circuit, the reference voltage VREF may be changed to cause a region in which the receiving buffer circuit is not operated. Furthermore, in order to operate in a period where the level of the reference voltage VREF is high according to the change of the reference voltage VREF, the sizes of the first and second resistors R1 and R2 are typically reduced. However, in this case, it may be difficult to secure a high gain. In other words, since the reference voltage VREF is changed in the HTT condition the input circuit may not be normally operated to cause a period in which the first and second output signals OIN and OREF are not normally outputted. Furthermore, when the reference voltage VREF has a high level, it may be difficult to secure a high gain.

SUMMARY

Various embodiments are directed to a semiconductor device capable of optimizing an output signal according to change of a reference voltage.

In an embodiment of the present invention, an input circuit may include: an internal bias generation unit suitable for generating first and second bias voltages in response to a first enable signal; a buffer control unit suitable for comparing a reference voltage to the first and second bias voltages, and generating a plurality of buffer control signals based upon the comparison of the reference voltage with the first and second bias voltages; and a buffer unit including a plurality of buffers, wherein a buffer is driven to receive the reference voltage and an external input signal, and generates an internal signal, in response to an activated buffer control signal among the plurality of buffer control signals.

The plurality of buffers may have internal transistors set to different threshold voltages and sizes, respectively.

The buffer control unit may include: an enable signal control unit suitable for receiving the first and second bias voltages in response to the first enable signal, and generating second and third enable signals of which activations are controlled according to the reference voltage; and a buffer control signal generation unit suitable for generating the plurality of buffer control signals for controlling the operation of the buffer unit in response to the first to third enable signals.

The enable signal control unit may include: a first enable signal generation unit suitable for activating the second enable signal when the reference voltage has a higher voltage level than the first bias voltage; and a second enable signal generation unit suitable for activating the third enable signal when the reference voltage has a higher voltage level than the second bias voltage.

The buffer control signal generation unit may include: a first buffer control signal generator suitable for activating a first buffer control signal among the plurality of buffer control signals when the reference voltage has a higher voltage level than the second bias voltage; a second buffer control signal generator suitable for activating a second buffer control signal among the plurality of buffer control signals when the reference voltage has a higher voltage level than the first bias voltage and has a lower voltage level than the second bias voltage; and a third buffer control signal generator suitable for activating a third buffer control signal among the plurality of buffer control signals when the reference voltage has a lower voltage level than the first bias voltage.

The buffer unit may include first to third buffers which are driven in response to the first to third buffer control signals, respectively, and the first to third buffers comprise input transistors having different threshold voltages and sizes and sink transistors having different sizes, respectively.

The internal bias generation unit may include: a level setting unit suitable for generating a preset level of operating current in response to the first enable signal; a first bias providing unit suitable for generating the first bias voltage in response to the operating current; and a second bias providing unit suitable for generating the second bias voltage in response to the first enable signal and a voltage supplied to the level setting unit.

The level setting unit may include: a pulse generation unit suitable for generating a pulse signal in response to the first enable signal; a driving unit driven in response to the first enable signal and the pulse signal, and suitable for receiving a supply voltage and generating a driving current; and an operating current generation unit suitable for generating the operating current by changing the driving current according to a resistance value preset in response to the its driving current.

The second bias voltage may have a lower level than the supply voltage, and the first bias voltage has a lower level than the second bias voltage.

The internal bias generation unit may include a Widlar bias circuit.

In an embodiment of the present invention, a semiconductor device may include: an input circuit suitable for receiving an external signal and generating an internal signal; and an internal circuit suitable for operating in response to the internal signal received from the input circuit, wherein the input circuit comprises: an internal bias generation unit suitable for generating a first bias voltage and a second bias voltage in response to a first enable signal, the second bias voltage having a higher voltage level than the first bias voltage; a buffer control unit suitable for comparing a reference voltage to the first and second bias voltages and generating first to third buffer control signals corresponding to the reference voltage; and a buffer unit including first to third buffers, wherein a buffer among the first to third buffer control signals is driven to receive the reference voltage and the external signal, and generates the internal signal, in response to an activated buffer control signal among the plurality of buffer control signals.

The plurality of buffers may have internal transistors set to different threshold voltages and sizes, respectively.

The buffer control unit may include: first and second enable signal control units suitable for receiving the first and second bias voltages in response to the first enable signal, and generating second and third enable signals of which activations are controlled according to the reference voltage, respectively; and first to third buffer control signal generators suitable for generating the first to third buffer control signals for controlling the operations of the first to third buffer units in response to the first to third enable signals, respectively.

The first enable signal control unit may activate the second enable signal when the reference voltage has a higher voltage level than the first bias voltage, and the second enable signal control unit activates the third enable signal when the reference voltage has a higher voltage level than the second bias voltage.

The first buffer control signal generators may activate the first buffer control signal when the reference voltage has a higher voltage level than the second bias voltage.

The second buffer control signal generators may activate the second buffer control signal when the reference voltage has a higher voltage level than the first bias voltage and has a lower voltage than the second bias voltage.

The third buffer control signal generators may activate the third buffer control signal when the reference voltage has a lower voltage level than the first bias voltage.

The internal bias generation unit may include: a level setting unit suitable for generating a preset level of operating current in response to the first enable signal; a first bias providing unit suitable for generating the first bias voltage in response to the operating current; and a second bias providing unit suitable for generating the second bias voltage in response to the first enable signal and a voltage supplied to the level setting unit.

The level setting unit include: a pulse generation unit suitable for generating a pulse signal in response to the first enable signal; a driving unit driven in response to the first enable signal and the pulse signal, and suitable for receiving a supply voltage and generating a driving current; and an operating current generation unit suitable for generating the operating current by changing the driving current according to a resistance value preset in response to the driving current.

The internal circuit may include a semiconductor memory device.

DETAILED DESCRIPTION

Figure 1:
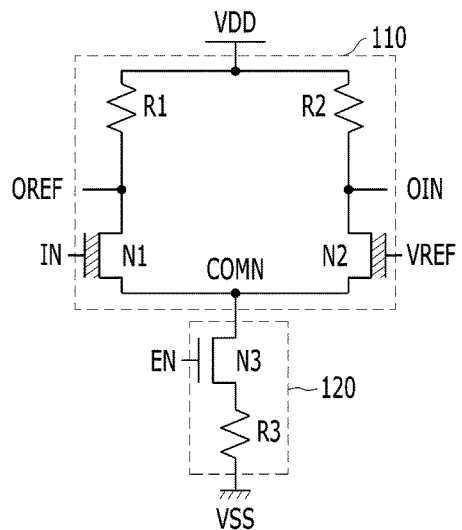
FIG. 1 is a diagram illustrating an input circuit installed in a conventional semiconductor device.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term and/or includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Figure 2:
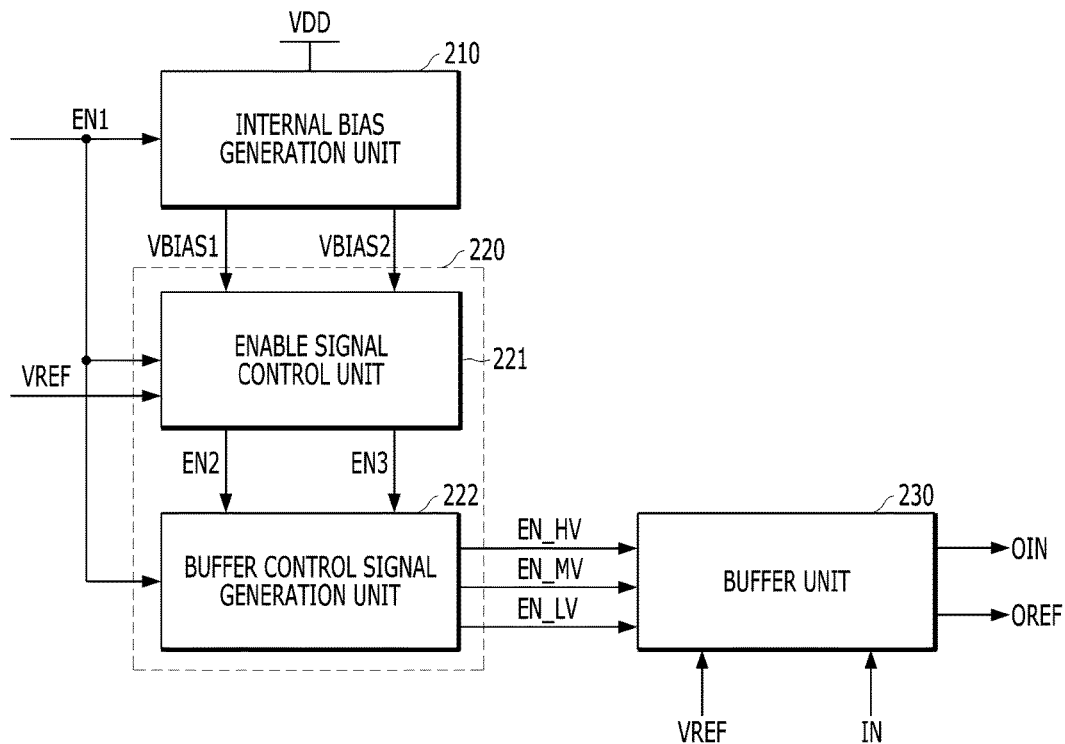
FIG. 2 is a diagram illustrating an input circuit in accordance with an embodiment of the present invention.

FIG. 2 is a diagram illustrating an input circuit in accordance with an embodiment of the present invention.

Referring to FIG. 2, the input circuit may include an internal bias generation unit 210, a buffer control unit 220 and a buffer unit 230.

The internal bias generation unit 210 may generate a bias voltage in response to a first enable signal EN1. The bias voltage may include a first bias voltage VBIAS1 and a second bias voltage VBIAS2. In an embodiment of the present invention, the internal bias generation unit 210 may include a current source capable of generating a small constant current using a relatively small resistor. The internal bias generation unit 210 may include a Widlar current source.

The buffer control unit 220 may be operated in response to the first enable signal EN1, and sense changes of a reference voltage VREF to generate first to third buffer control signals EN_HV, EN_MV and EN_LV based on the first or second bias voltage VBIAS1 or VBIAS2.

The buffer control unit 220 may include an enable signal control unit 221 and a buffer control signal generation unit 222.

The enable signal control unit 221 may be operated according to the first enable signal EN1. The enable signal control unit 221 may receive the first bias voltage VBIAS1 and the reference voltage VREF and generate a second enable signal EN2 by comparing the reference voltage VREF and the first bias voltage VBIAS1, or receive the second bias voltage VBIAS2 and the reference voltage VREF and generate a third enable signal EN3 by comparing the reference voltage VREF and the second bias voltage VBIAS2.

The buffer control signal generation unit 222 may generate the first to third buffer control signals EN_HV, EN_MV and EN_LV in response to the first to third enable signals EN1 to EN3.

The buffer control signal generation unit 222 may activate any one of the first to third buffer control signals EN_HV, EN_MV and EN_LV according to the reference voltage VREF. For example, the buffer control signal generation unit 222 may activate the third buffer control signal EN_LV when the reference voltage VREF is lower than the first bias voltage VBIAS1, activate the second buffer control signal EN_MV when the reference voltage VREF is higher than the first bias voltage VBIAS1 and lower than the second bias voltage VBIAS2, and activate the first buffer control signal EN_HV when the reference voltage VREF is higher than the second bias voltage VBIAS2.

The buffer unit 230 may be operated in response to the first to third buffer control signals EN_HV, EN_MV and EN_LV, and receive the reference voltage VREF and an external signal IN to generate internal signals OIN and OREF. The buffer unit 230 may include a plurality of buffer circuits which are driven according to the first to third control signals EN_HV, EN_MV and EN_LV, respectively. According to a change of the reference voltage VREF, any one of the buffer circuits may be selectively operated. The plurality of buffer circuits may include input transistors (e.g., N17 and N18, N20 and N21 and N23 and N24 in FIG. 6), respectively, which may have different threshold voltages.

As the reference voltage VREF is changed, the input circuit in accordance with an embodiment of the present invention can operate a buffer circuit having an input transistor and sink transistor, which are optimized to the situation. In general, when a reference voltage having a high level is inputted, the size of a load resistor needs to be reduced in order to normally operate a buffer circuit. However, when the size of the load resistor is reduced, it is difficult to secure a high gain. The present invention overcomes this issue associated with heretofore devices. Specifically, according to an embodiment of the present invention, when reference voltage is raised, a transistor having a large threshold voltage may be applied as an input transistor. Then, the input transistor can be operated in a saturation region while the size of the load resistor is increased, thus obtaining a high gain.

Figure 3:
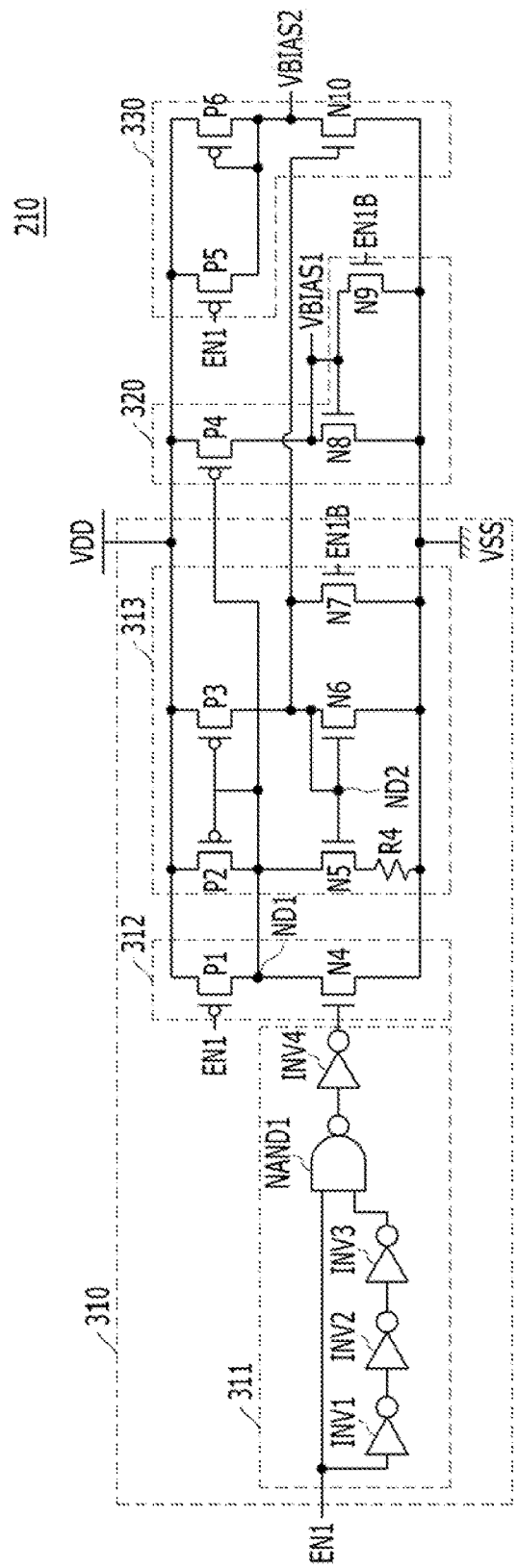
FIG. 3 is a circuit diagram illustrating an internal bias generation unit of FIG. 2.

FIG. 3 is a circuit diagram illustrating the internal bias generation unit 210 of FIG. 2.

Referring to FIG. 3, the internal bias generation unit 210 may include a level setting unit 310, a first bias providing unit 320 and a second bias providing unit 330.

The level setting unit 310 may be driven in response to the first enable signal EN1, and receive a supply voltage VDD to generate an operating current.

The level setting unit 310 may include a pulse generation unit 311, a driving unit 312 and an operating current generation unit 313.

The pulse generation unit 311 may include a delay unit including inverts INV1, INV2 and INV3 and a combination unit including a NAND gate NAND1 and an inverter INV4. The delay unit INV1, INV2 and INV3 may delay the first enable signal EN1 by a predetermined time. The combination unit NAND1 and INV4 may generate a pulse signal according to a combination of the first enable signal EN1 and an output signal of the delay unit INV1, INV2 and INV3.

The driving unit 312 may be driven in response to the first enable signal EN1 and the pulse signal outputted from the pulse generation unit 311, and generate a driving current corresponding to the level of the supply voltage VDD. The pulse generation unit 311 and the driving unit 312 may serve as a start-up circuit for setting the initial value of the operating current generation unit 313.

The driving unit 312 may include a first PMOS transistor P1 and a fourth NMOS transistor N4. The first PMOS transistor P1 may be driven in response to the first enable signal EN1, and receive the supply voltage VDD to provide a driving current to a first node ND1. The fourth NMOS transistor N4 may be driven in response to the pulse signal outputted from the pulse generation unit 311, and is coupled between the first node ND1 and a ground voltage terminal VSS.

The operating current generation unit 313 may be driven by a driving current applied to the first node ND1, and generate an operating current by changing the current amount of the first node ND1 in response to a preset resistance value. The operating current generation unit 313 may include a current mirror circuit having a fourth resistor R4 as a source degeneration resistor.

The operating current generation unit 313 may include second and third PMOS transistors P2 and P3, fifth, sixth and seventh NMOS transistors N5, N6 and N7, and the fourth resistor R4.

The second PMOS transistor P2 may be driven by a voltage applied to the first node ND1, and is coupled between the supply voltage terminal VDD and the first node ND1. That is, the second PMOS transistor P2 may be diode-coupled between the first node ND1 and the supply voltage terminal VDD.

The third PMOS transistor P3 may be driven by the voltage applied to the first node ND1, and is coupled between the supply voltage terminal VDD and a second node ND2.

The fifth NMOS transistor N5 and the fourth resistor R4 is coupled in series between the first node ND1 and the ground voltage terminal VSS. The fifth NMOS transistor N5 may be driven by a voltage applied to the second node ND2. Thus, the amount of current applied to the first node ND1 may be determined according to the size of the fourth resistor R4 and whether the fifth NMOS transistor N5 is driven.

The sixth NMOS transistor N6 may be driven by the voltage applied to the second node ND2, and is coupled between the second node ND2 and the ground voltage terminal VSS. That is, the sixth NMOS transistor N6 may be diode-coupled between the second node ND2 and the ground voltage terminal VSS.

The seventh NMOS transistor N7 may be driven by the inverted first enable signal EN1B, and is coupled between the second node ND2 and the ground voltage terminal VSS. The seventh NMOS transistor N7 may operate as a reset circuit of the internal bias generation unit 210.

As the first enable signal EN1 is enabled in the level setting unit 310, the driving current generated by the driving unit 312 may be applied to the first node ND1. The operating current generation unit 313 may be driven by the driving current, and adjust the amount of driving current according to the size of the fourth resistor R4, such that the operating current is applied to the first node ND1.

For example, when the first enable signal EN1 is enabled to a high level, the first PMOS transistor P1 may be turned off, and a low-level voltage may be applied to the first node ND1. The second and third PMOS transistors P2 and P3 may be turned on according to the low-level voltage applied to the first node ND1.

As a voltage obtained by subtracting the threshold voltage of the third PMOS transistor P3 from the supply voltage VDD is applied to the second node ND2, the fifth and sixth NMOS transistors N5 and N6 may be turned on. Furthermore, since the inverted first enable signal EN1B has a low level, the seventh NMOS transistor N7 may be turned off.

Thus, an operating current obtained by changing the driving current by an amount corresponding to the size of the fourth resistor R4 may be applied to the first node ND1.

The first bias providing unit 320 may be driven by the operating current applied to the first node ND1, and generate the first bias voltage VBIAS1.

The first bias providing unit 320 may include a fourth PMOS transistor P4 and eighth and ninth NMOS transistors N8 and N9, which are coupled in series between the supply voltage terminal VDD and the ground voltage terminal VSS.

The fourth PMOS transistor P4 may receive the supply voltage VDD, and output the first bias voltage VBIAS1 according to the voltage level applied to the first node ND1.

The eighth NMOS transistor N8 may be diode-coupled between an output terminal of the first bias voltage VBIAS1 and the ground voltage terminal VSS.

The ninth NMOS transistor N9 may be driven in response to an inverted enable signal EN1B, and is coupled between the output terminal of the first bias voltage VBIAS1 and the ground voltage terminal VSS.

When the first enable signal EN1 is enabled, the first bias voltage VBIAS1 may be generated at a level corresponding to 0.6 of the supply voltage VDD, that is, 0.6*VDD.

The second bias providing unit 330 may be driven in response to the first enable signal EN1, and generate the second bias voltage VBIAS2 from the supply voltage VDD.

The second bias providing unit 330 may include fifth and sixth PMOS transistors P5 and P6 and a tenth NMOS transistor N10.

The fifth PMOS transistor P5 may be driven in response to the first enable signal EN1, and is coupled between the supply voltage terminal VDD and an output terminal of the second bias voltage VBIAS2.

The sixth PMOS transistor P6 is coupled between the supply voltage terminal VDD and the output terminal of the second bias voltage VBIAS2.

The tenth NMOS transistor N10 may be driven according to the voltage level applied to the second node ND2, and is coupled between the output terminal of the second bias voltage VBIAS2 and the ground voltage terminal VSS.

When the first enable signal EN1 is at a high level, the fifth PMOS transistor P5 may be turned off, but the sixth PMOS transistor P6 may be turned on. The tenth NMOS transistor N10 may be turned on.

Thus, the level of the second bias voltage VBIAS2 may be adjusted according to the sizes of the sixth PMOS transistor P6 and the tenth NMOS transistor N10. When the first enable signal EN1 is enabled, the second bias voltage VBIAS2 may be generated at a level corresponding to 0.8 of the supply voltage VDD, that is, 0.8*VDD.

Figure 4:
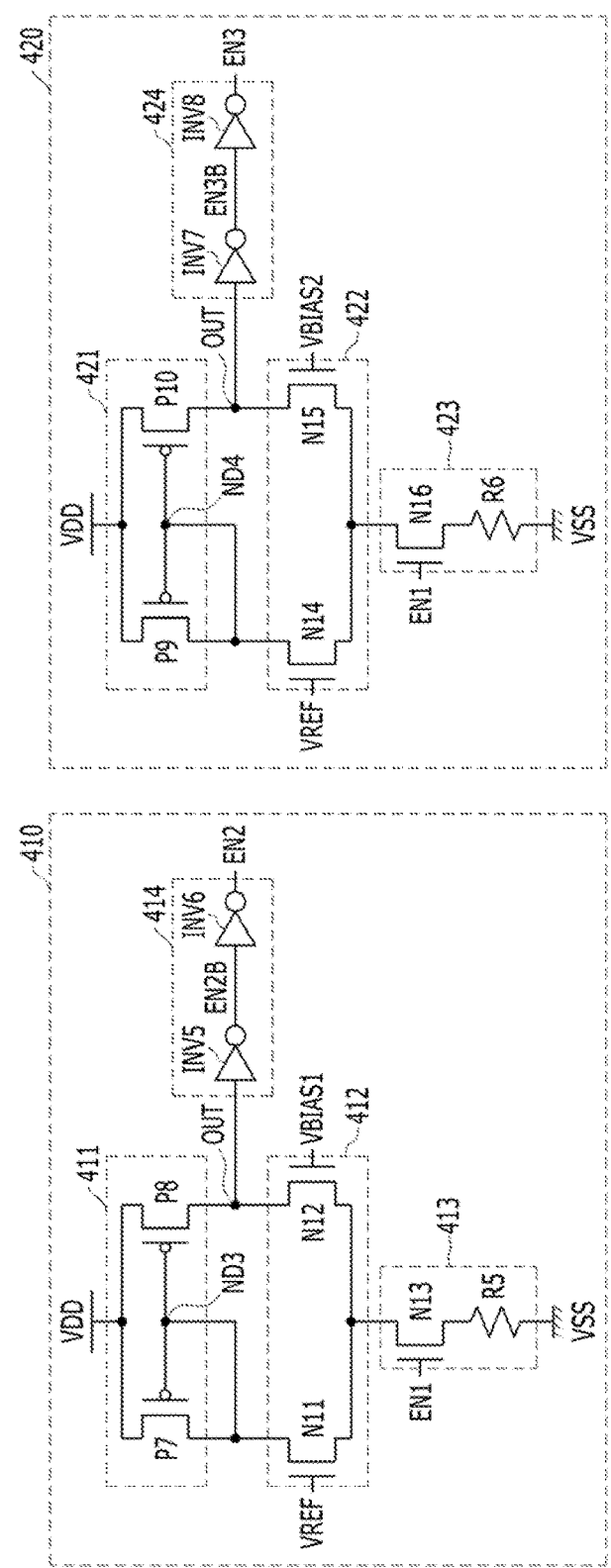
FIG. 4 is a circuit diagram illustrating an enable signal control unit of FIG. 2.

FIG. 4 is a circuit diagram illustrating the enable signal control unit 221 of FIG. 2.

Referring to FIG. 4, the enable signal control unit 221 may include a first enable signal generation unit 410 and a second enable signal generation unit 420.

The first enable signal generation unit 410 may generate the second enable signal EN2 by comparing the reference voltage VREF and the first bias voltage VBIAS1. The second enable signal generation unit 420 may generate the third enable signal EN3 by comparing the reference voltage VREF and the second bias voltage VBIAS2. Since the first and second enable signal generation units 410 and 420 are operated and configured in the same manner, the following descriptions will be focused on the first enable signal generation unit 410.

The first enable signal generation unit 410 may include a current providing unit 411, a comparison unit 412, a current sink unit 413 and an output unit 414.

The current providing unit 411 may include seventh and eighth PMOS transistors P7 and P8.

The seventh PMOS transistor P7 may be driven by a voltage applied to the third node ND3, and is coupled between the supply voltage terminal VDD and the third node ND3. The eighth PMOS transistor P8 may be driven by the voltage applied to the third node ND3, and is coupled between the supply voltage terminal VDD and an output terminal OUT.

The comparison unit 412 may include 11th and 12th NMOS transistors N11 and N12.

The 11th NMOS transistor N11 may be coupled between the third node ND3 and the current sink unit 413, and driven in response to the reference voltage VREF. The 12th NMOS transistor N12 may be coupled between the output node OUT and the current sink unit 413, and driven in response to the first bias voltage VBIAS1.

The current sink unit 413 may include a 13th NMOS transistor N13 and a fifth resistor R5 which are coupled between the comparison unit 412 and the ground voltage terminal VSS. The 13th NMOS transistor N13 may be driven in response to the first enable signal EN1. The fifth resistor R5 may be coupled between the 13th NMOS transistor N13 and the ground voltage terminal VSS. The fifth resistor R5 may serve as a source degeneration resistor which controls the amount of current passing through the 13th NMOS transistor N13 such that the current amount does not become excessive. A voltage obtained by subtracting a voltage drop across the fifth resistor R5 from a voltage between the first enable signal EN1 and the ground voltage terminal VSS may be applied as the gate-source voltage VGS of the 13th NMOS transistor N13. In other words, when a large amount of current flows into the 13th NMOS transistor N13, the gate-source voltage VGS of the 13th NMOS transistor N13 may be decreased in case where the voltage across the fifth resistor R5 is increased. As a result, the current flowing into the 13th NMOS transistor N13 may be controlled not to become excessive.

The operation of the first enable signal generation unit 410 in accordance with the present embodiment will be described as follows.

The first enable signal generation unit 410 may output a low-level output signal to the output terminal OUT when the first bias voltage VBIAS1 is higher than the reference voltage VREF. The first enable signal generation unit 410 may output a high-level output signal to the output terminal OUT when the first bias voltage VBIAS1 is lower than the reference voltage VREF.

The output unit 414 including inverters INV5 and INV6 may invert the high-level or low-level output signal outputted to the output terminal OUT two times, and output the inverted signal as the second enable signal EN2.

The second enable signal generation unit 420 may also output a low-level output signal to the output terminal OUT when the second bias voltage VBIAS2 is higher than the reference voltage VREF. The second enable signal generation unit 420 may output a high-level output signal to the output terminal OUT when the second bias voltage VBIAS2 is lower than the reference voltage VREF. Thus, the output unit 424 including inverters INV7 and INV8 within the second enable signal generation unit 420 may invert the high-level or low-level output signal outputted to the output terminal OUT two times, and output the inverted signal as the third enable signal EN3.

In short, when the reference voltage VREF is lower than the first bias voltage VBIAS1, both of the second and third enable signals EN2 and EN3 may have a low level. When the reference voltage VREF is higher than the first bias voltage VBIAS1 and lower than the second bias voltage VBIAS2, the second enable signal EN2 may have a low level, and the third enable signal EN3 may have a high level. Finally, when the reference voltage VREF is higher than the second bias voltage VBIAS2, both of the second and third enable signals EN2 and EN3 may have a high level.

Figure 5:
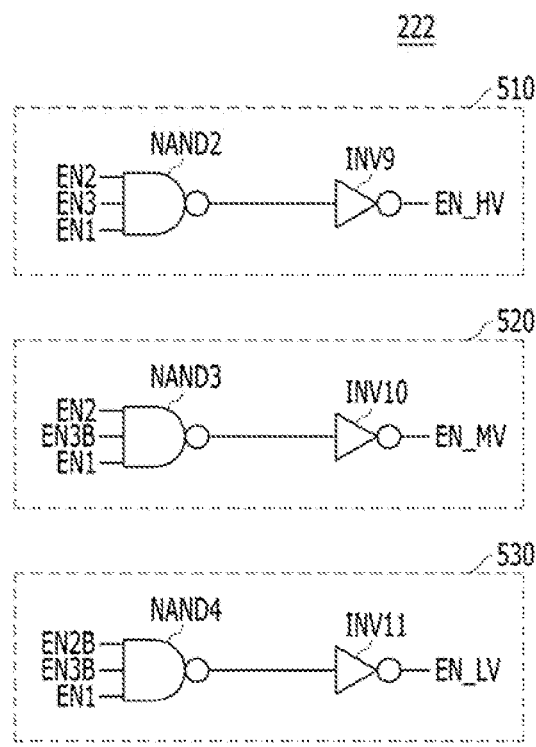
FIG. 5 is a circuit diagram illustrating a buffer control signal generation unit of FIG. 2.

FIG. 5 is a circuit diagram illustrating the buffer control signal generation unit 222 of FIG. 2.

Referring to FIG. 5, the buffer control signal generation unit 222 may include first to third buffer control signal generator 510 to 530.

The first to third buffer control signal generator 510 to 530 may include NAND gates NAND2 to NAND4 and inverters INV9 to INV11, respectively.

The first buffer control signal generator 510 may receive the first to third enable signals EN1 to EN3, and generate the first buffer control signal EN_HV by logically combining the received signals through the NAND gate NAND2 and the inverter INV9.

The second buffer control signal generator 520 may receive the first and second enable signals EN1 and EN2 and the inverted third enable signal EN3B, and generate the second buffer control signal EN_MV by logically combining the received signals through the NAND gate NAND3 and the inverter INV10.

The third buffer control signal generator 530 may receive the first enable signal EN1, the inverted second enable signal EN2B and the inverted third enable signal EN3B, and generate the third buffer control signal EN_LV by logically combining the received signals through the NAND gate NAND4 and the inverter INV11.

Referring to FIGS. 4 and 5, the operation will be described. At this time, the operation may be classified into three cases according to the level of the reference voltage VREF.

First, when the reference voltage VREF is lower than the first bias voltage VBIAS1, both of the second and third enable signals EN2 and EN3 may be set to a low level. Thus, the inverted second and third enable signals EN2B and EN3B may have a high level, and the third buffer control signal generator 530 receiving the first enable signal EN1 and the inverted second and third enable signals EN2B and EN3B may generate the activated third buffer control signal EN_LV.

Second, when the reference voltage VREF is higher than the first bias voltage VBIAS1 and lower than the second bias voltage VBIAS2, the second enable signal EN2 may be set to a low level, and the third enable signal EN3 may be set to a low level. Thus, the inverted third enable signal EN3B may have a high level. The second buffer control signal generator 520 receiving the first and second enable signals EN1 and EN2 and the inverted third enable signal EN3B may generate the activated second buffer control signal EN_MV.

Finally, when the reference voltage VREF is higher than the second bias voltage VBIAS2, both of the second and third enable signals EN2 and EN3 may be set to a high level. Thus, the first buffer control signal generator 510 receiving the first to third enable signals EN1 to EN3 may generate the activated first buffer control signal EN_HV.

Figure 6:
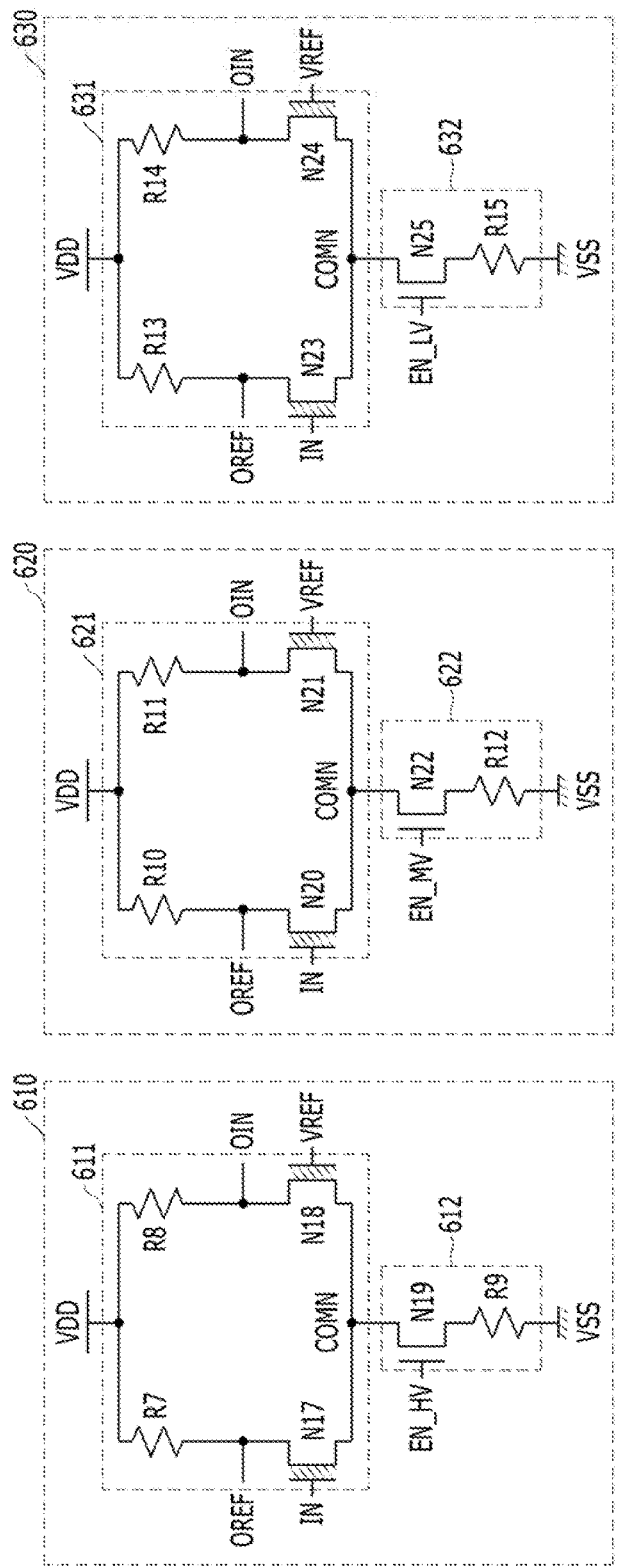
FIG. 6 is a circuit diagram illustrating a buffer unit of FIG. 2.

FIG. 6 is a circuit diagram illustrating the buffer unit 230 of FIG. 2.

Referring to FIG. 6, the buffer unit 230 may include first to third buffers 610 to 630. Each of the buffers 610 to 630 may include differential amplification units 611, 621 and 631 and current sink units 612, 622 and 632, respectively.

The first buffer 610 may be driven in response to the first buffer control signal EN_HV, the second buffer 620 may be driven in response to the second buffer control signal EN_MV, and the third buffer 630 may be driven in response to the third buffer control signal EN_LV.

The first to third buffers 610 to 630 may include 17th and 18th NMOS transistors N17 and N18, 20th and 21st NMOS transistors N20 and N21, and 23rd and 24th NMOS transistors N23 and N24, respectively, which serve as input transistors for receiving the input signal IN and the reference voltage VREF, and have different threshold voltages and sizes.

In the case of a general NMOS transistor, a drain-source voltage VDS may be larger than or equal to a value obtained by subtracting a threshold voltage VTH from a gate-source voltage VGS. When the reference voltage VREF rises, the gate-source voltage VGS may be increased, and the threshold voltage VTH may be relatively decreased. Thus, as the reference voltage VREF is high, a transistor having a high threshold voltage VTH needs to be used.

Thus, among the transistors of the current sink units 612, 622 and 632 or the 19th NMOS transistor N19, the 22nd NMOS transistor N22 and the 25th NMOS transistor N25 which receive the first to third buffer control signals EN_HV, EN_MV and EN_LV as enable signals, the 19th NMOS transistor N19 of the first buffer 610 may have the highest threshold voltage, the 19th NMOS transistor N19 being operated when the highest reference voltage VREF is applied. The 22nd NMOS transistor N22 of the second buffer 620 may have the second highest threshold voltage, and the 25th NMOS transistor N25 of the third buffer 630 may have the lowest threshold voltage.

Since the first to third buffers 610 to 630 are configured and operated in the same manner except the above-described configurations, the following descriptions will be focused on the first buffer unit 610.

The first buffer 610 may include a differential amplification unit 611 and a current sink unit 612. The differential amplification unit 611 may generate the first and second output signals OIN and OREF by differentially amplifying the input signal IN and the reference voltage VREF. The current sink unit 612 may control the amount of current flowing through the differential amplification unit 611.

The differential amplification unit 611 may include a seventh resistor R7, an eighth resistor R8, a 17th NMOS transistor N17 and an 18th NMOS transistor N18. The seventh resistor R7 may be coupled between a supply voltage terminal VDD and a second output node OREF. The eighth resistor R8 may be coupled between the supply voltage terminal VDD and a first output node OIN. The 17th NMOS transistor N17 may form a current path between the second output node OREF and the common node COMN in response to the input signal IN. The 18th NMOS transistor N18 may form a current path between the first output node OIN and the common node COMN. The differential amplification unit 611 may receive the input signal IN and the reference voltage VREF using the 17th and 18th NMOS transistors N17 and N18. The differential amplification unit 611 may be referred to as an NMOS type differential amplifier.

The current sink unit 612 may include a 19th NMOS transistor N19 and a ninth resistor R9 which are coupled in series between the common mode COMN and the ground voltage terminal VSS.

The current sink unit 612 may be driven in response to the first buffer control signal EN_HV, and control the amount of current flowing through the differential amplification unit 611 by adjusting the amount of current sinking from the differential amplification unit 611 to the ground voltage terminal VSS. At this time, the operation of controlling the current amount may be performed by the ninth resistor R9. The ninth resistor R9 may serve as a source degeneration resistor which controls the amount of current flowing through the 19th NMOS transistor N19 such that the current amount does not become excessive.

In short the input circuit in accordance with the present embodiment may determine whether to activate the first to third buffer control signals EN_HV, EN_MV and EN_LV according to the changing reference voltage VREF, and operate a buffer unit corresponding to an activated signal among the first to third buffer control signals EN_HV, EN_MV and EN_LV. In other words, as the reference voltage VREF is changed, the input circuit can drive a buffer including an input transistor and sink transistor which are optimized to the situation. Thus, although a load resistor is increased, the input circuit can acquire a high gain.

Figure 7:
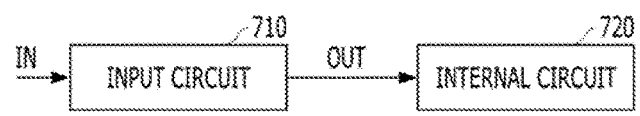
FIG. 7 is a diagram of a semiconductor device in accordance with an embodiment of the present invention.

FIG. 7 is a configuration diagram of a semiconductor device in accordance with an embodiment of the present invention.

Referring to FIG. 7, the semiconductor device may include an input circuit 710 and an internal circuit 720.

The input circuit 710 may receive an external signal IN and generate an internal signal OUT.

The internal circuit 720 may receive the internal signal OUT and perform a desired operation. The internal circuit 720 may include a semiconductor memory device. The semiconductor memory device may include a volatile memory device such as a dynamic random access memory (DRAM) or a nonvolatile memory device such as flash memory or resistive memory.

The input circuit described with reference to FIGS. 2 to 6 may be used as the input circuit 710. That is, the input circuit 710 may include a plurality of buffer circuits installed therein, the buffer circuits including transistors having different threshold voltages and sizes. The input circuit 710 can operate the optimal buffer circuit in response to a buffer control signal generated by comparing a bias generated by the internal bias generation unit 210 to a reference voltage.

Figure 8:
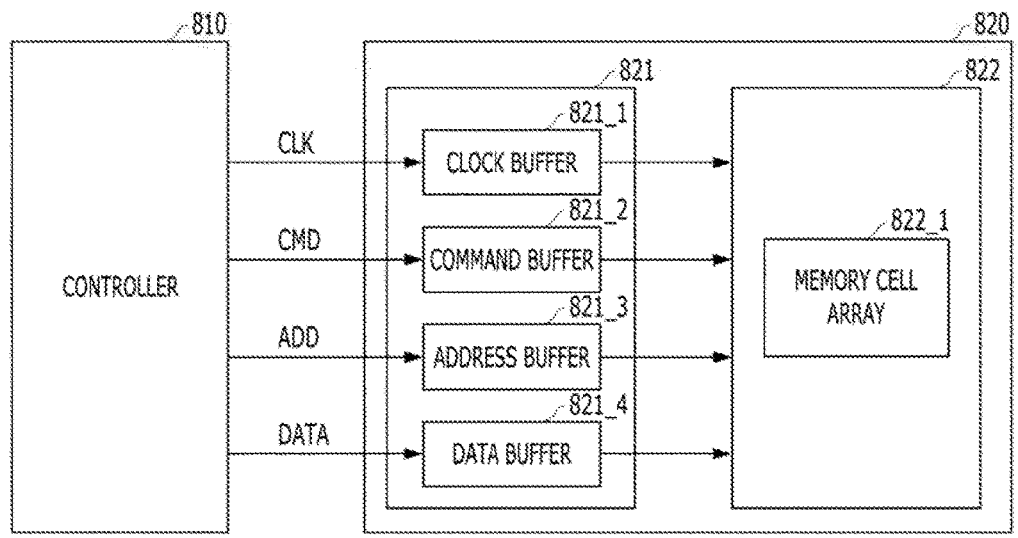
FIG. 8 is a diagram of a semiconductor device in accordance with another embodiment of the present invention.

FIG. 8 is a configuration diagram of a semiconductor device in accordance with another embodiment of the present invention.

Referring to FIG. 8, the semiconductor device may include a controller 810 and a memory device 820.

The memory device 820 may include an input circuit 821 and a memory core 822, and the memory core 822 may include a memory cell array 822_1. The memory device 820 may include a volatile memory device such as a dynamic random access memory (DRAM) or a nonvolatile memory device such as flash memory or resistive memory, but the present embodiment is not limited thereto.

Although not illustrated, the memory core 822 may include various components capable of writing and reading data to and from the memory cell array 822_1. For example, the memory core 822 may include an address decoder, a write circuit and a read circuit.

The memory device 820 may receive a dock signal CLK, command CMD address ADD and data DATA from the controller 810, and transmit data DATA stored in the memory cell array 822_1 to the controller 810 according to a request of the controller 810.

The input circuit 821 may include a clock buffer 821_1 for converting the clock signal CLK provided from the controller 810 into an internal clock signal, a command buffer 821_2 for converting the command CMD into an internal command, an address buffer 821_3 for converting the address ADD into an internal address, and a data buffer 821_4 for converting the data DATA into internal data.

Each or one or more of the clock buffer 821_1, the command buffer 821_2, the address buffer 821_3 and the data buffer 821_4 may be implemented with the input buffer described with reference to FIGS. 2 to 6.

Therefore, each or one or more of the clock buffer 821_1, the command buffer 821_2, the address buffer 821_3 and the data buffer 821_4, which constitute the input circuit 821, may include a plurality of buffer circuits installed therein, the buffer circuits including transistors having different threshold voltages and sizes. Thus, the input circuit 821 can operate the optimal buffer circuit in response to a buffer control signal generated by comparing a bias generated by the internal bias generation unit 210 to the reference voltage. In other words, although the reference voltage is changed, the buffer circuit optimized to the situation can be operated to guarantee the reliability of the semiconductor device.

In accordance with the present embodiment of the present invention, since the semiconductor device can use the input circuit which is optimized according to the change of the reference voltage, the reliability of the semiconductor device can be guaranteed.

Although various embodiments have been described for illustrative purposes, it will be apparent to those skilled in the art that various changes and modifications may be made without departing from the spirit and scope of the invention as defined in the following claims.

What is claimed is:

1. An input circuit comprising:
    an internal bias generation unit suitable for generating first and second bias voltages in response to a first enable signal;
    a buffer control unit suitable for comparing a reference voltage to the first and second bias voltages, and generating a plurality of buffer control signals based upon the comparison of the reference voltage with the first and second bias voltages; and
    a buffer unit including a plurality of buffers, wherein a buffer is driven to receive the reference voltage and an external input signal, and generates an internal signal, in response to an activated buffer control signal among the plurality of buffer control signals.

2. The input circuit of claim 1, wherein the plurality of buffers has internal transistors set to different threshold voltages and sizes, respectively.

3. The input circuit of claim 1, wherein the buffer control unit comprises:
    an enable signal control unit suitable for receiving the first and second bias voltages in response to the first enable signal, and generating second and third enable signals of which activations are controlled according to the reference voltage; and
    a buffer control signal generation unit suitable for generating the plurality of buffer control signals for controlling the operation of the buffer unit in response to the first to third enable signals.

4. The input circuit of claim 3, wherein the enable signal control unit comprises:
    a first enable signal generation unit suitable for activating the second enable signal when the reference voltage has a higher voltage level than the first bias voltage; and
    a second enable signal generation unit suitable for activating the third enable signal when the reference voltage has a higher voltage level than the second bias voltage.

5. The input circuit of claim 3, wherein the buffer control signal generation unit comprises:
    a first buffer control signal generator suitable for activating a first buffer control signal among the plurality of buffer control signals when the reference voltage has a higher voltage level than the second bias voltage;
    a second buffer control signal generator suitable for activating a second buffer control signal among the plurality of buffer control signals when the reference voltage has a higher voltage level than the first bias voltage and has a lower voltage level than the second bias voltage; and
    a third buffer control signal generator suitable for activating a third buffer control signal among the plurality of buffer control signals when the reference voltage has a lower voltage level than the first bias voltage.

6. The input circuit of claim 5, wherein the buffer unit comprises first to third buffers which are driven in response to the first to third buffer control signals, respectively, and the first to third buffers comprise input transistors having different threshold voltages and sizes and sink transistors having different sizes, respectively.

7. The input circuit of claim 1, wherein the internal bias generation unit comprises:
a level setting unit suitable for generating a preset level of operating current in response to the first enable signal;
a first bias providing unit suitable for generating the first bias voltage in response to the operating current; and
a second bias providing unit suitable for generating the second bias voltage in response to the first enable signal and a voltage supplied to the level setting unit.

8. The input circuit of claim 7, wherein the level setting unit comprises:
a pulse generation unit suitable for generating a pulse signal in response to the first enable signal;
a driving unit driven in response to the first enable signal and the pulse signal, and suitable for receiving a supply voltage and generating a driving current; and
an operating current generation unit suitable for generating the operating current by changing the driving current according to a resistance value preset in response to the driving current.

9. The input circuit of claim 8, wherein the second bias voltage has a lower level than the supply voltage, and the first bias voltage has a lower level than the second bias voltage.

10. The input circuit of claim 1, wherein the internal bias generation unit comprises a Widlar bias circuit.

11. A semiconductor device comprising:
an input circuit suitable for receiving an external signal and generating an internal signal; and
an internal circuit suitable for operating in response to the internal signal received from the input circuit,
wherein the input circuit comprises:
an internal bias generation unit suitable for generating a first bias voltage and a second bias voltage in response to a first enable signal, the second bias voltage having a higher voltage level than the first bias voltage;
a buffer control unit suitable for comparing a reference voltage to the first and second bias voltages and generating first to third buffer control signals corresponding to the reference voltage; and
a buffer unit including first to third buffers, wherein a buffer among the first to third buffers is driven to receive the reference voltage and the external signal, and generates the internal signal, in response to an activated buffer control signal among the first to third buffer control signals.

12. The semiconductor device of claim 11, wherein the first to third buffers has internal transistors set to different threshold voltages and sizes, respectively.

13. The semiconductor device of claim 11, wherein the buffer control unit comprises:
first and second enable signal control units suitable for receiving the first and second bias voltages in response to the first enable signal, and generating second and third enable signals of which activations are controlled according to the reference voltage, respectively; and
first to third buffer control signal generators suitable for generating the first to third buffer control signals for controlling the operations of the first to third buffer units in response to the first to third enable signals, respectively.

14. The semiconductor device of claim 13, wherein the first enable signal control unit activates the second enable signal when the reference voltage has a higher voltage level than the first bias voltage, and the second enable signal control unit activates the third enable signal when the reference voltage has a higher voltage level than the second bias voltage.

15. The semiconductor device of claim 13, wherein the first buffer control signal generator activates the first buffer control signal when the reference voltage has a higher voltage level than the second bias voltage.

16. The semiconductor device of claim 13, wherein the second buffer control signal generator activates the second buffer control signal when the reference voltage has a higher voltage level than the first bias voltage and has a lower voltage than the second bias voltage.

17. The semiconductor device of claim 13, wherein the third buffer control signal generator activates the third buffer control signal when the reference voltage has a lower voltage level than the first bias voltage.

18. The semiconductor device of claim 11, wherein the internal bias generation unit comprises:
a level setting unit suitable for generating a preset level of operating current in response to the first enable signal;
a first bias providing unit suitable for generating the first bias voltage in response to the operating current; and
a second bias providing unit suitable for generating the second bias voltage in response to the first enable signal and a voltage supplied to the level setting unit.

19. The semiconductor device of claim 18, wherein the level setting unit comprises:
a pulse generation unit suitable for generating a pulse signal in response to the first enable signal;
a driving unit driven in response to the first enable signal and the pulse signal, and suitable for receiving a supply voltage and generating a driving current; and
an operating current generation unit suitable for generating the operating current by changing the driving current according to a resistance value preset in response to the driving current.

20. The semiconductor device of claim 11, wherein the internal circuit comprises a semiconductor memory device.

* * * * *